United States Patent

Rutherford et al.

[15] 3,671,866

[45] June 20, 1972

[54] PULSE PROCESSING CIRCUIT HAVING IMPROVED RANGE RESOLUTION

[72] Inventors: Kenneth R. Rutherford; Marvin L. Hooker, Jr., both of Cedar Rapids, Iowa; Joseph P. Alibrandi, Raleigh, N.C.

[73] Assignee: Collins Radio Company, Cedar Rapids, Iowa

[22] Filed: Jan. 8, 1971

[21] Appl. No.: 104,875

[52] U.S. Cl. ..............................325/322, 325/341, 328/54, 328/55, 328/71, 328/147, 329/145

[51] Int. Cl. ..............................H04b 1/16

[58] Field of Search ..............................325/321–326, 341, 325/474, 476; 328/53–56, 71, 78, 112, 146–151, 163, 168, 169, 173, 196; 329/145; 343/17.1

[56] References Cited

UNITED STATES PATENTS

| | | | |
|---|---|---|---|
| 3,509.279 | 4/1970 | Martin et al. | 325/326 |
| 3,075,149 | 1/1963 | Marshall | 328/196 |

*Primary Examiner*—Albert J. Mayer
*Attorney*—Richard W. Anderson and Robert J. Crawford

[57] ABSTRACT

A pulse processing circuitry which substantially eliminates pulse position variations caused by compression of pulses in IF stages of video receivers as a result of conflicting requirements for narrow bandwidth and large dynamic range. The variations are eliminated while retaining the pulse width characteristics of a pulse train by splitting the input pulse into two signal channels, delaying the pulse in one channel for a predetermined interval, applying the delayed pulse to trigger a ramp generator, and comparing the resulting ramp signal with a reference level signal produced by the pulse in the second channel.

3 Claims, 2 Drawing Figures

Figure 1:
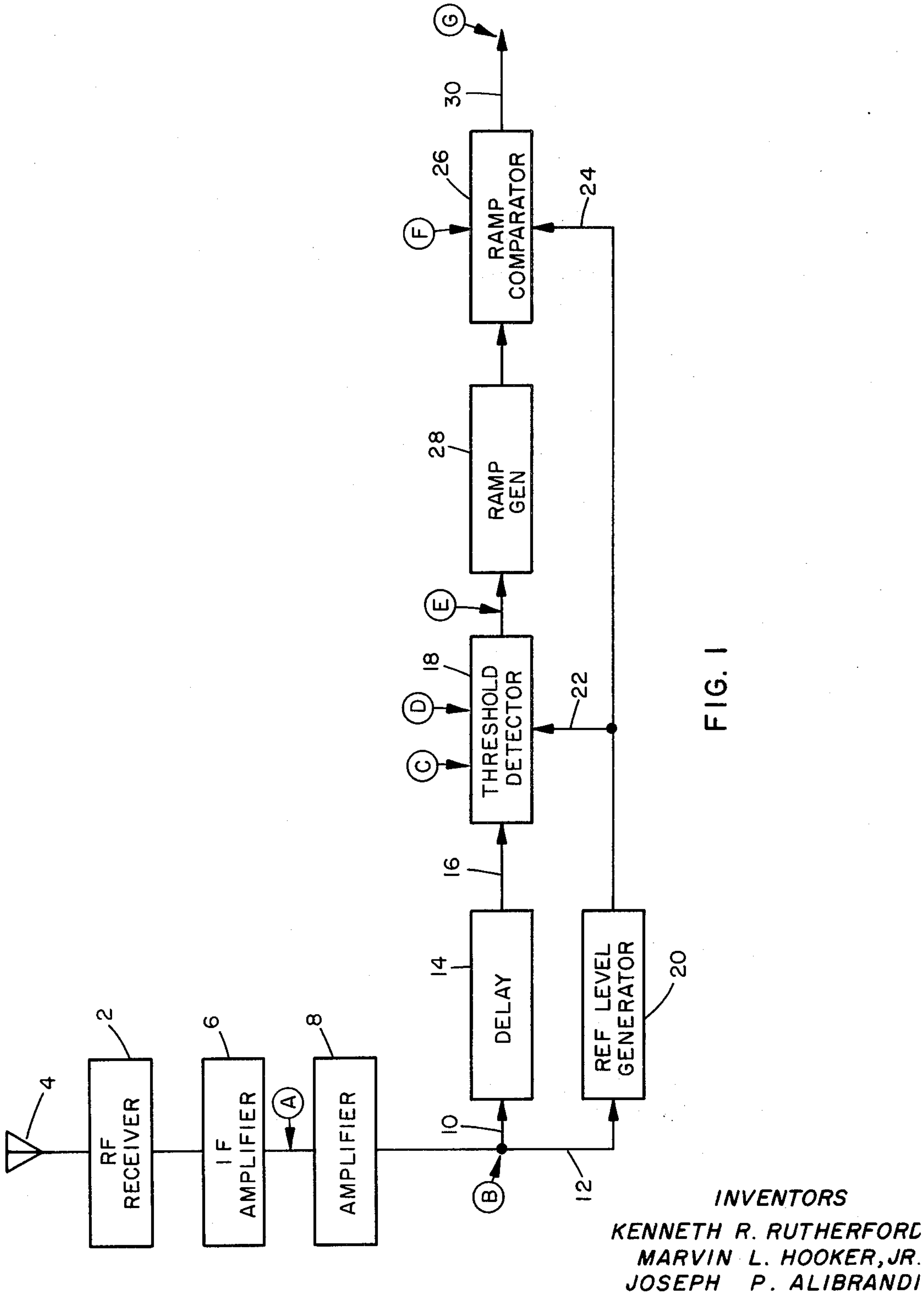

INVENTORS
KENNETH R. RUTHERFORD
MARVIN L. HOOKER, JR.
JOSEPH P. ALIBRANDI

*INVENTORS*

*KENNETH R. RUTHERFORD*
*MARVIN L. HOOKER, JR.*
*JOSEPH P. ALIBRANDI*

PULSE PROCESSING CIRCUIT HAVING IMPROVED RANGE RESOLUTION

This invention relates to pulse processing circuitry and is particularly directed to circuitry for improving the range resolution of pulse ranging systems and the like.

Pulse ranging systems, such as transponders and distance measuring equipment, have become essential for aircraft navigation and traffic control. However, as the use of such devices becomes more widespread and as the number of aircraft increases, the need for greater accuracy becomes imperative. Unfortunately, the accuracy of the prior art devices has been limited due to pulse position variations caused by compression of pulses in the IF stage as a result of the conflicting requirements for narrow bandwidth and large dynamic range.

These disadvantages of the prior art are overcome with the present invention, and pulse processing circuitry is provided which substantially eliminates such pulse position variations while retaining the pulse width characteristics of the input pulses.

The advantages of the present invention are preferably attained by providing pulse processing circuitry comprising means for splitting the input pulse into two signal channels, delaying the pulse in one channel for a predetermined interval, applying the delayed pulse to trigger a ramp generator, and comparing the resulting ramp signal with a reference level signal produced by the pulse in the second channel.

Accordingly, it is an object of the present invention to provide improved pulse processing circuitry.

Another object of the present invention is to provide pulse processing circuitry having improved range resolution.

An additional object of the present invention is to provide pulse processing circuitry which is not subject to pulse position variation due to variations in pulse amplitude.

A specific object of the present invention is to provide improved pulse processing circuitry comprising means for splitting the input pulse into two signal channels, delaying the pulse in one channel for a predetermined interval, applying the delayed pulse to trigger a ramp generator, and comparing the resulting ramp signal with a reference level signal produced by the pulse in the second channel.

These and other objects and features of the present invention will be apparent from the following detailed description taken with reference to the accompanying drawing.

Figure 2:
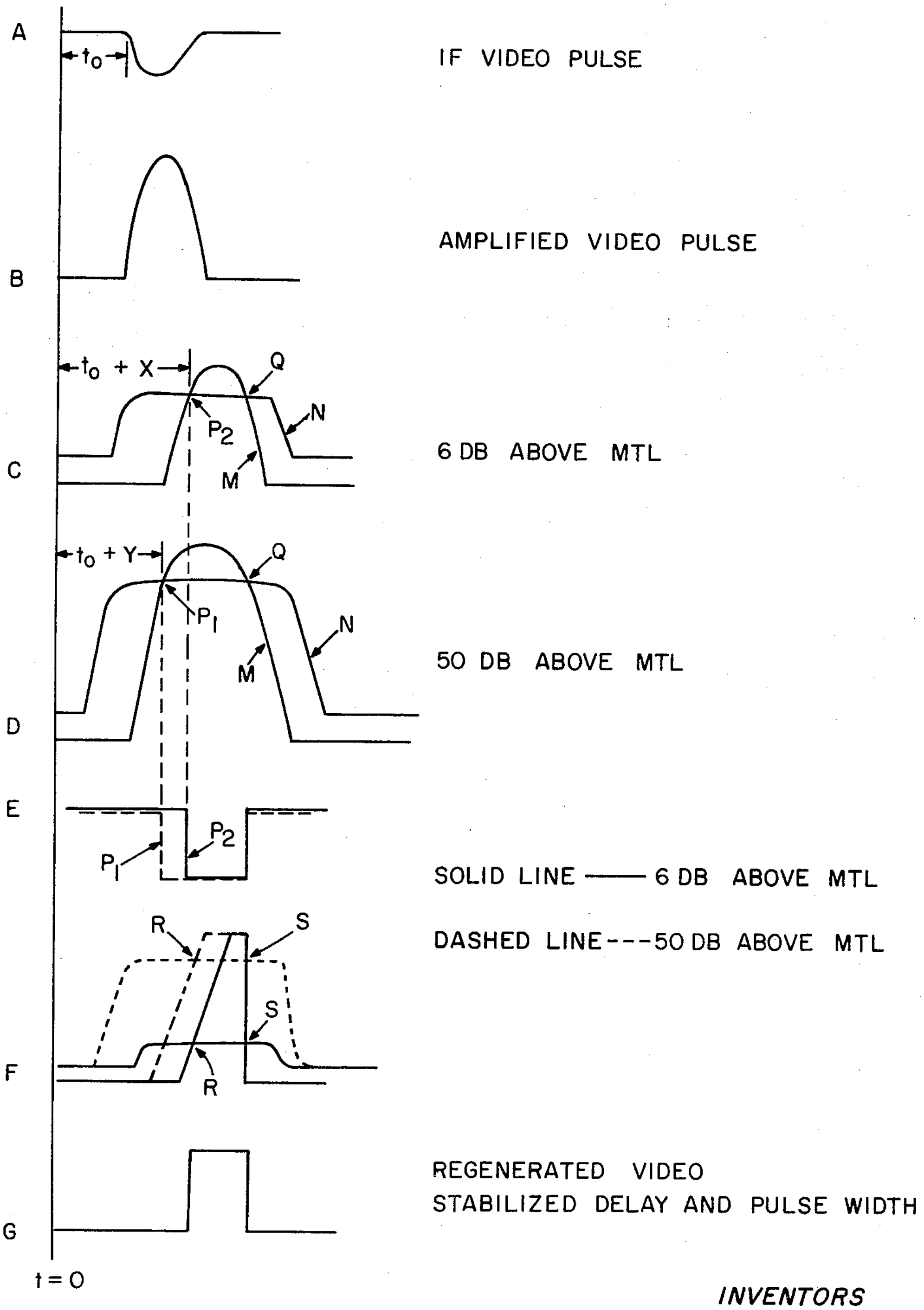

In the drawing:

FIG. 1 is a block diagram of pulse processing circuitry embodying the present invention; and FIG. 2 is a diagrammatic representation of the signal waveforms appearing at designated points in the circuit of FIG. 1.

In that form of the present invention chosen for purposes of illustration, FIG. 1 shows a radio receiver 2 which receives pulse-type radio signals from an antenna 4 and passes these pulses through an IF amplifier 6. The pulses are compressed in passing through the IF amplifier 6, just as in the devices of the prior art. The compressed pulses are further amplified by amplifier 8 and are then split into two signal channels, as seen at 10 and 12. The signal in channel 10 is passed to a delay circuit 14, which provides a time delay slightly greater than the worst-case rise time of the pulses from amplifier 8 and is then applied to one input 16 of a threshold detector 18. The signal in channel 12 is applied to a reference level generator 20 comprising a peak-charging and peak-clipping circuit. The output of the reference level generator 20 is applied to input 22 of threshold detector 18 and is also applied to input 24 of ramp comparator circuit 26. Threshold detector 18 compares the delayed pulse, on input 16, with the reference level signal, on input 22. When the amplitude of the delayed pulse rises above that of the reference level signal, as seen at points $P_1$ and $P_2$ in curves C and D of FIG. 2, threshold detector 18 passes a signal which triggers ramp generator 28 to start applying a ramp signal to ramp comparator circuit 26. Subsequently, when the amplitude of the delayed pulse falls below the amplitude of the reference level signal, or seen at point Q in curves C and D of FIG. 3, threshold detector 18 passes a signal to cause ramp generator 28 to discontinue applying the ramp signal to ramp comparator 26. Ramp comparator circuit 26 compares the ramp signal with the reference level signal from input 24 and generates a pulse on output 30 which starts when the amplitude of the ramp signal rises above that of the reference level signal, as seen at points R in curve F of FIG. 2, and terminates when the ramp signal does, as seen at points S in curve F of FIG. 2.

In operation, the incoming video pulses are amplified and compressed by the IF amplifier 6 which causes the leading edges of large amplitude pulses to be advanced. To overcome this, the pulses are applied to separate signal channels 10 and 12. The pulses in channel 10 are delayed for a time interval slightly in excess of the worst case rise time and are then applied to input 16 of threshold detector 18. The pulses in channel 12 are applied to reference level generator 20 which emits a plateau-type signal having a maximum amplitude which is a predetermined proportion of the amplitude of the pulse applied thereto. This reference level signal is applied to input 22 of the threshold detector 18. Curves C and D of FIG. 2 show the operation of the threshold detector 18 for input pulses having amplitudes exceeding the mean threshold level by 6 decibels and 50 decibels, respectively. In each case, the delayed pulse, indicated at M, is compared with the reference level signal, indicated at N. When the amplitude of the delayed pulse M rises above the reference level signal N, as seen at points $P_1$ and $P_2$, the threshold detector 18 initiates a signal to trigger the ramp generator 28. Curve E of FIG. 2 shows the output signal from the threshold detector 18 and, by comparing curve E with curves C and D, it will be seen that the start of the output signal from threshold detector 18 will be advanced in proportion with the amplitude of the input video pulse and, hence, the start of the ramp signal will be similarly advanced. The ramp signal is applied to the ramp comparator 26 which also receives the reference level signal on input 24. The ramp comparator 26 compares the ramp signal with the reference level signal, as seen in curve F of FIG. 2. In curve F, the solid lines represent the signals at 6 decibels above the mean threshold level; while the dashed lines represent the signals at 50 decibels above the mean threshold level. It will be seen that due to the different starting points, caused by the signal of curve E, the two ramp signals intersect their respective reference level signals at the same point in time, as indicated at R, and terminate at the same point in time, as indicated at S. When the amplitude of the ramp signal rises above that of the corresponding reference level signal, as seen at point R in curve F, the ramp comparator 26 initiates an output pulse, as seen in curve G of FIG. 2, which is terminated when the amplitude of the ramp signal falls below that of the corresponding reference level signal, as seen at point 5 in curve F. Thus, the output pulse of curve F has stabilized delay and pulse width characteristics, regardless of the amplitude of the pulse received by the receiver 2.

Obviously, numerous variations and modifications can be made without departing from the present invention. Accordingly, it should be clearly understood that the form of the present invention described above and shown in the accompanying drawing is illustrative only and is not intended to limit the scope of the invention.

What Is claimed Is:

1. Pulse processing circuitry comprising:

input means for receiving pulses to be processed and for applying said pulses simultaneously to two separate signal channels, delay means connected in one of said signal channels and serving to provide a predetermined time delay for the pulses in said one of said signal channels, a reference level generator connected to receive the pulses in the second of said signal channels and emitting a reference signal having a maximum amplitude which is less than the amplitude of the pulses applied thereto by a predetermined value, a threshold detector connected to receive the delayed pulses from said delay means and the reference signal from said reference level generator and operative to pass a triggering signal whenever and for as long as the amplitude of said delayed pulse exceeds the amplitude of said reference signal, a ramp generator connected to receive said triggering signal from said threshold detector and responsive thereto to generate a ramp signal beginning at the start of said triggering signal and terminating at the end of said triggering signal, and ramp comparator means connected to receive said ramp signal and said reference signal and operative to emit an output pulse whenever and for as long as the amplitude of said ramp signal exceeds that of said reference signal.

2. The apparatus of claim 1 wherein said reference level generator comprises:

a peak charging circuit, and a peak clipping circuit.

3. The method of pulse processing comprising the steps of:

splitting an input pulse into two signal channels, delaying the pulse in one of said signal channels, generating a reference signal having an amplitude which is a predetermined proportion of the amplitude of said pulse, comparing the amplitude of said pulse with the amplitude of said reference signal, triggering a ramp signal when the amplitude of said pulse rises above that of said reference level, terminating said ramp signal when the amplitude of said pulse falls below that of said reference level, comparing the amplitude of said ramp signal with the amplitude of said reference signal, and emitting an output signal whenever and for as long as the amplitude of said ramp signal exceeds the amplitude of said reference signal.

* * * * *